United States Patent
Yin et al.

(10) Patent No.: US 8,916,449 B2
(45) Date of Patent: Dec. 23, 2014

(54) PACKAGE STRUCTURE AND SUBSTRATE BONDING METHOD

(71) Applicant: Asia Pacific Microsystems, Inc., Hsinchu (TW)

(72) Inventors: Hung-Lin Yin, Hsinchu (TW); Jerwei Hsieh, Hsinchu (TW); Li-Yuan Lin, Hsinchu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 0 days.

(21) Appl. No.: 13/836,807

(22) Filed: Mar. 15, 2013

(65) Prior Publication Data

US 2013/0285248 A1    Oct. 31, 2013

(30) Foreign Application Priority Data

Apr. 26, 2012 (TW) .............................. 101114983 A

(51) Int. Cl.
| | | |
|---|---|---|
| *H01L 21/30* | (2006.01) | |
| *H01L 21/46* | (2006.01) | |
| *H01L 23/498* | (2006.01) | |
| *H01L 21/762* | (2006.01) | |
| *H01L 23/10* | (2006.01) | |
| *H01L 21/50* | (2006.01) | |
| *H01L 23/00* | (2006.01) | |
| *H01L 25/065* | (2006.01) | |
| *H01L 25/00* | (2006.01) | |
| *B81C 1/00* | (2006.01) | |

(52) U.S. Cl.
CPC .... *H01L 23/49866* (2013.01); *H01L 21/76251* (2013.01); *H01L 23/10* (2013.01);

(Continued)

(58) Field of Classification Search
CPC . H01L 2924/00; H01L 21/00; H01L 2224/00; B23K 35/00; C22C 13/00
USPC .................. 257/762, E23.021, 772; 438/455; 428/646
See application file for complete search history.

(56) References Cited

U.S. PATENT DOCUMENTS

| | | |
|---|---|---|
| 5,668,033 A | 9/1997 | Ohara et al. |
| 6,229,190 B1 | 5/2001 | Bryzek et al. |

(Continued)

FOREIGN PATENT DOCUMENTS

JP    2005150417 A    6/2005

OTHER PUBLICATIONS

Zhao et al. "Solid/Liquid Interface of Ag/Sn/Ag Trilayers by In Situ Resistivity Measurement", 1998, Chinese Physical Society vol. 15, No. 3, pp. 205-207.*

*Primary Examiner* — Telly Green
(74) *Attorney, Agent, or Firm* — Alan D. Kamrath; Kamrath IP Lawfirm, P.A.

(57) ABSTRACT

A substrate bonding method comprises the following steps. Firstly, a first substrate and a second substrate are provided, wherein a surface of the first substrate is covered by a first Ag layer and a surface of the second substrate is covered by a second Ag layer and a metallic layer from bottom to top, wherein the metallic layer comprises a first Sn layer. Secondly, a bonding process is performed by aligning the first and second substrates followed by bringing the metallic layer into contact with the first Ag layer followed by applying a load while heating to a predetermined temperature in order to form Ag3Sn intermetallic compounds. Finally, cool down and remove the load to complete the bonding process.

8 Claims, 11 Drawing Sheets

(52) U.S. Cl.
CPC ............... *H01L 21/50* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 24/95* (2013.01); *H01L 25/0657* (2013.01); *H01L 25/50* (2013.01); *B81C 1/00269* (2013.01); H01L 2224/48091 (2013.01); H01L 2224/48463 (2013.01); H01L 2224/29084 (2013.01); H01L 2224/1308 (2013.01); H01L 2224/83948 (2013.01); H01L 2224/81011 (2013.01); H01L 2224/27462 (2013.01); H01L 2224/03614 (2013.01); H01L 2224/32148 (2013.01); H01L 2224/81825 (2013.01); H01L 2224/32146 (2013.01); H01L 2224/81948 (2013.01); H01L 2224/81013 (2013.01); H01L 2224/32235 (2013.01); H01L 2224/48148 (2013.01); H01L 24/03 (2013.01); H01L 24/05 (2013.01); H01L 24/11 (2013.01); H01L 24/27 (2013.01); H01L 24/48 (2013.01); H01L 2224/0347 (2013.01); H01L 2224/05073 (2013.01); H01L 2224/05166 (2013.01); H01L 2224/05171 (2013.01); H01L 2224/05655 (2013.01); H01L 2224/05669 (2013.01); H01L 2224/1145 (2013.01); H01L 2224/11462 (2013.01); H01L 2224/1147 (2013.01); H01L 2224/13082 (2013.01); H01L 2224/13111 (2013.01); H01L 2224/13139 (2013.01); H01L 2224/16148 (2013.01); H01L 2224/16238 (2013.01); H01L 2224/16507 (2013.01); H01L 2224/2745 (2013.01); H01L 2224/29011 (2013.01); H01L 2224/2908 (2013.01); H01L 2224/29082 (2013.01); H01L 2224/29111 (2013.01); H01L 2224/29139 (2013.01); H01L 2224/32238 (2013.01); H01L 2224/32503 (2013.01); H01L 2224/32507 (2013.01); *H01L 2224/48228* (2013.01); *H01L 2224/73103* (2013.01); *H01L 2224/73203* (2013.01); *H01L 2224/73215* (2013.01); *H01L 2224/81121* (2013.01); *H01L 2224/81193* (2013.01); *H01L 2224/81203* (2013.01); *H01L 2224/83013* (2013.01); *H01L 2224/83022* (2013.01); *H01L 2224/83121* (2013.01); *H01L 2224/83193* (2013.01); *H01L 2224/83203* (2013.01); *H01L 2224/83805* (2013.01); *H01L 2224/83825* (2013.01); *H01L 2224/9202* (2013.01); *H01L 2224/92147* (2013.01); *H01L 2224/95* (2013.01); *H01L 2224/81022* (2013.01); *H01L 2224/2747* (2013.01); *H01L 2224/16503* (2013.01); *H01L 2224/83011* (2013.01); *H01L 2224/11614* (2013.01); *H01L 2224/27614* (2013.01); *B81C 2203/019* (2013.01)
USPC ........................ 438/455; 257/678; 257/686

(56) References Cited

U.S. PATENT DOCUMENTS

| | | | | |
|---|---|---|---|---|
| 6,805,974 | B2* | 10/2004 | Choi et al. | 428/646 |
| 7,586,664 | B2* | 9/2009 | O'Shaughnessy | 359/265 |
| 7,943,411 | B2 | 5/2011 | Martin et al. | |
| 8,298,680 | B2* | 10/2012 | Van Veen et al. | 428/548 |
| 8,381,964 | B2* | 2/2013 | Liu et al. | 228/180.21 |
| 2003/0156969 | A1* | 8/2003 | Choi et al. | 420/560 |
| 2007/0002422 | A1* | 1/2007 | O'Shaughnessy | 359/265 |
| 2007/0042211 | A1* | 2/2007 | Love et al. | 428/548 |
| 2007/0059548 | A1* | 3/2007 | Love et al. | 428/610 |
| 2009/0162622 | A1* | 6/2009 | Van Veen et al. | 428/198 |
| 2010/0183896 | A1* | 7/2010 | Liu et al. | 428/647 |
| 2012/0199635 | A1* | 8/2012 | Liu et al. | 228/206 |
| 2013/0021765 | A1* | 1/2013 | Van Veen et al. | 361/764 |
| 2013/0095381 | A1* | 4/2013 | Oukassi et al. | 429/209 |

* cited by examiner

PACKAGE STRUCTURE AND SUBSTRATE BONDING METHOD

CROSS-REFERENCE TO RELATED APPLICATION

This application claims priority from Taiwan Patent Application No. 101114983, filed on Apr. 26, 2012, the contents of which are hereby incorporated by reference in their entirety for all purposes.

FIELD OF THE INVENTION

The present invention relates to a substrate bonding method and particularly to a substrate bonding method by using Ag3Sn intermetallic compound.

BACKGROUND OF THE INVENTION

Conventionally semiconductor chip packages use molded underfill and lead frame or ceramic substrate, but recently many micro chips adopt wafer-level package. Wafer-level package uses a chip cap to protect the sensitive circuitries or vulnerable structures within chips such as the suspended movable devices of MEMS (Micro Electro Mechanical System) sensing chips from impacts of external environment. Many MEMS sensing chips such as accelerometers or pressure sensors usually are wafer bonded to a glass or silicon wafer with a plurality of recesses in order to protect their sensing structures or diaphragm and also provide structures such as hermetic seal and through-silicon via (TSV).

Commonly used wafer bonding techniques comprise fusion bonding, anodic bonding and bonding with intermediates such as eutectic bonding or polymer bonding. Since fusion bonding and anodic bonding are limited to silicon to silicon or silicon to silicon dioxide bonding and silicon to sodium-containing glass bonding respectively and these two bonding techniques require low roughness of wafer surfaces, these two bonding techniques could not be applied widely. Therefore, wafer bonding techniques using compatible interlayers or bonding pairs are adopted more frequently. In such a case, glass frit is widely used for consumer electronics. However, glass frit requires using screen printing to form bond ring, so it is impossible to form bond rings with width less than 100-200 µm. This limitation poses great challenges to the trend of continuous miniaturizing of chip sizes. In a case of using polymers (such as BCB or photoresist), photolithography processes can be used to form bond rings with great precision, so width of bond ring can be reduced significantly. However, polymers may out gas when exposed to high temperature and their bonding strength is weaker, so they may affect the reliability of products.

In an eutectic bonding process by bringing specific metals into contact under a relatively low temperature to form eutectic phase, metallic layers would be formed on a MEMS wafer and a cap wafer and patterned. After applying a load to bring two wafers into contact, heating them to a temperature higher than eutectic temperature and keeping the temperature for a while, these two wafers would be bonded together. In this kind of eutectic bonding process, metals commonly used in or compatible with semiconductor manufacturing processes are often chosen. For example, U.S. Pat. No. 7,943,411 taught using an Al—Ge eutectic bonding process to bond a cap wafer on a MEMS wafer. Since the eutectic temperature for Al—Ge is 419° C., process temperature would be increased to 430-450° C. in order to form a stable bonding. However, such a high temperature would adversely affect some film stacks and the thermal stress therefrom would lead to deformation or functional failure of the sensing film/films. U.S. Pat. No. 5,668,033 disclosed using an Au—Si eutectic bonding process to bond a cap on an accelerometer chip. Since the eutectic temperature for Au—Si is 363° C., process temperature would be slightly reduced to 390-410° C. However, this process comes with some disadvantages such as higher cost of Au and challenges of native oxide formed on the Si surface. Therefore, there is a need to develop an eutectic bonding technique compatible with semiconductor manufacturing processes, using lower eutectic temperature and with lower cost to perform capping process on a MEMS apparatus. U.S. Pat. No. 6,229,190 disclosed using an Ag—Sn eutectic bonding process. In such a process, Ag or Sn are formed on a pressure sensor and a cap wafer respectively and then a capping and bonding process is conducted on the pressure sensor. Since the eutectic temperature for Ag—Sn is 221° C. that is much lower than the eutectic temperature for Al—Ge and Au—Si, it could significantly avoid the thermal stress issues mentioned before. Aside from this benefit, its rather low cost (much lower than Au) makes it a promising technique. However, this bonding technique suffers from low melting point (about 230° C.) and low mechanical strength of the brittle Sn. If the package product made by Ag—Sn eutectic bonding process still contains high ratio of pure Sn, this pure Sn not only would reduce the strength of bonding interface but also would damage the package product while ensuing process temperature (such as process in reflow furnace involving a temperature of 250° C.) is higher than its melting point 230° C.

SUMMARY OF THE INVENTION

In light of the above reasons, the present invention provides a novel packaging method to improve qualities of bonded wafers and allow practices onto mass production.

In accordance with a preferred embodiment of the present invention, a package structure is provided to comprise: a first substrate; a second substrate; and a plurality of metallic film stacks disposed between the first substrate and the second substrate, wherein each of the plurality of metallic film stacks comprises at least a first Ag layer, a second Ag layer and an alloy layer between the first Ag layer and the second Ag layer, wherein the alloy layer comprises Ag3Sn intermetallic compounds and a Sn matrix.

In accordance with another preferred embodiment of the present invention, a substrate bonding method is provided to comprise the following steps. Firstly, a first substrate and a second substrate are provided, wherein a surface of the first substrate is covered by a first Ag layer and a surface of the second substrate is covered by a second Ag layer and a metallic layer from bottom to top, wherein the metallic layer comprises a first Sn layer. Secondly, a bonding process is performed by aligning the first and second substrates followed by bringing the metallic layer into contact with the first Ag layer followed by applying a load to while heating the first substrate and the second substrate to a predetermined temperature in order to form Ag3Sn intermetallic compounds. Finally, cool down and remove the load to complete the bonding process.

The above and other objects, features and advantages of the present invention will become more readily apparent to those ordinarily skilled in the art after reviewing the following detailed description and accompanying drawings.

DETAILED DESCRIPTION OF PREFERRED EMBODIMENTS

Figure 1:
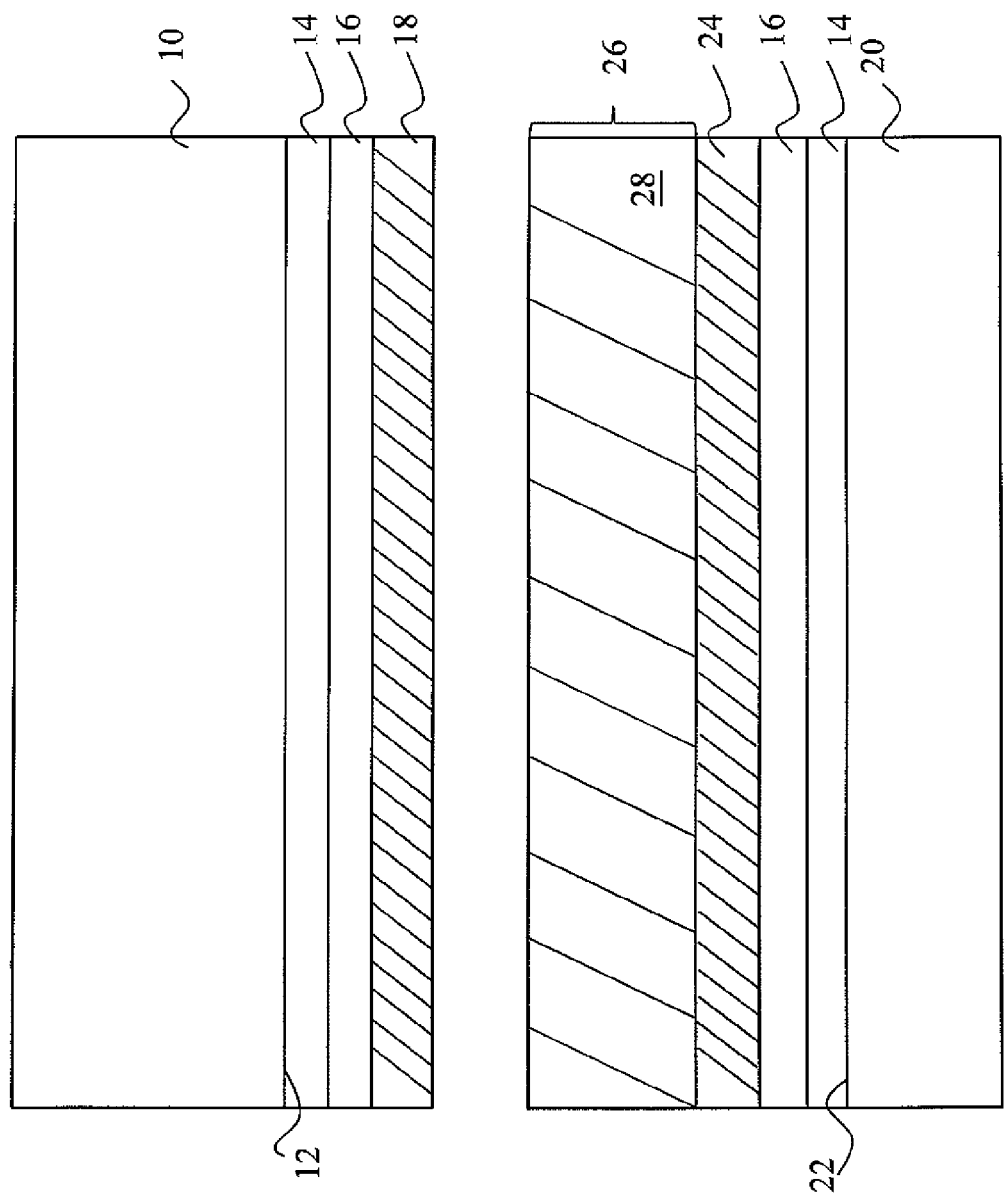
FIGS. 1-3 illustrate a substrate bonding method in accordance with the first preferred embodiment of the present invention.
Figure 2:
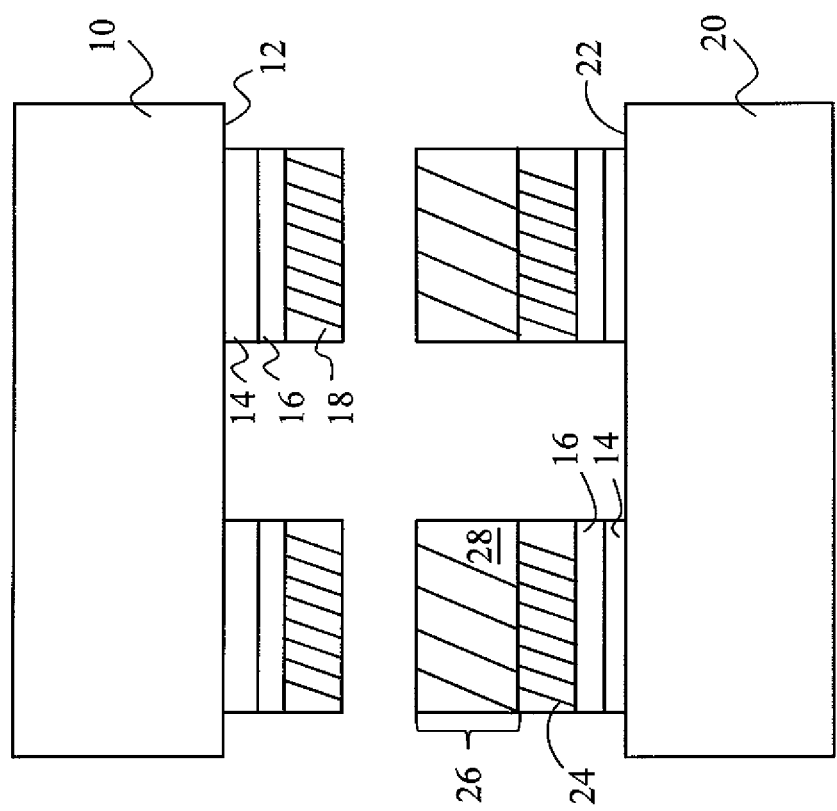
Figure 3:
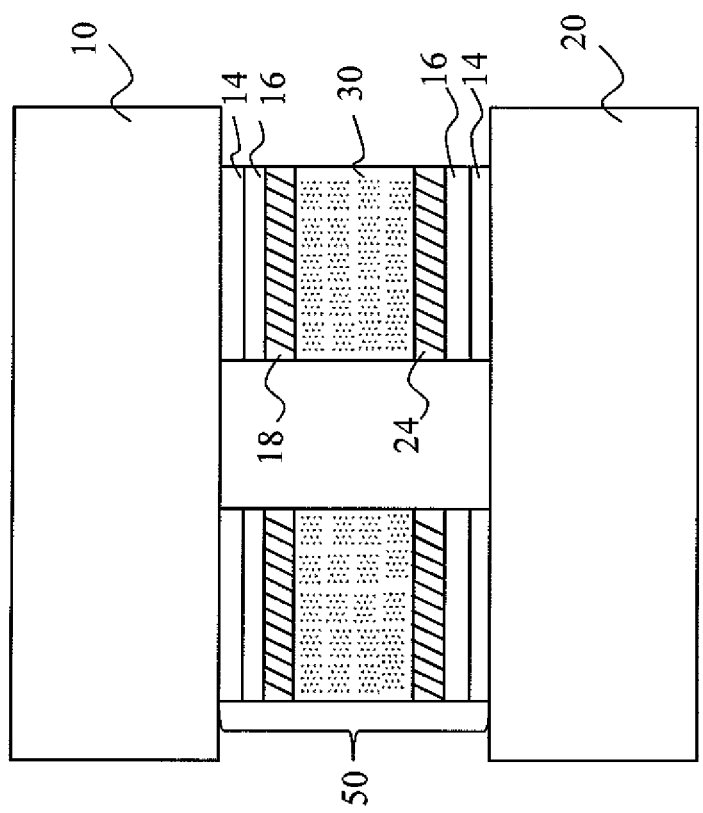

FIGS. 1-3 illustrate a substrate bonding method in accordance with the first preferred embodiment of the present invention. Please refer to FIG. 1. Firstly, a first substrate 10 and a second substrate 20 are provided. The first substrate 10 and second substrate 20 may be any substrates made by any materials suitable for electronic packaging such as silicon, GaAs, Sapphire, metallic materials, ceramic materials, glass or other semiconductor materials. The first substrate 10 has a first surface 12 and the second substrate 20 has a second surface 22, and both of the first surface 12 and the second surface 22 are surfaces configured to contain devices. An adhesion layer 14, a barrier layer 16 and a first Ag layer 18 are formed sequentially on the first surface 12 of the first substrate 10. An adhesion layer 14, a barrier layer 16, a second Ag layer 24 and a metallic layer 26 are formed sequentially on the second surface 22 of the first substrate 20, wherein the metallic layer 26 comprises a first Sn layer 28. The adhesion layer 14 comprises Cr or Ti and the barrier layer 16 comprises Ni and/or Pt. The first Ag layer 18, the second Ag layer 24 and the metallic layer 26 may be formed by electron beam evaporation, sputtering deposition or electroplating process. As shown in FIG. 2, the adhesion layer 14, barrier layer 16 and first Ag layer 18 of the first substrate 10 and the adhesion layer 14, barrier layer 16, second Ag layer 24 and metallic layer 26 are patterned by either a combination of photolithography and etching processes or a lift-off process. After being patterned, the remained adhesion layer 14, barrier layer 16, first Ag layer 18, second Ag layer 24 and metallic layer 26 would form a bonding ring after the ensuing processes.

Figure 4:
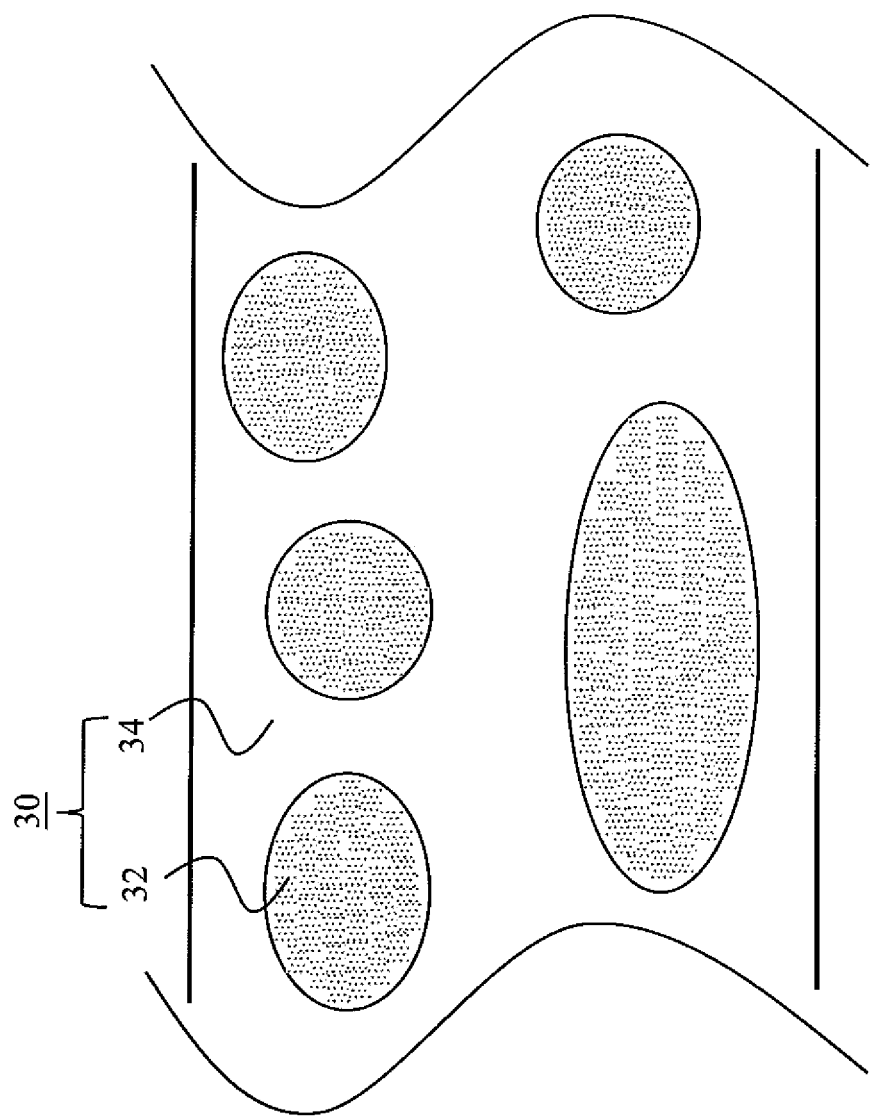
FIG. 4 is a schematic enlarged view of the alloy metal.

Then, a pre-cleaning process may be performed. This pre-cleaning process may take a form of a wet-etching process using for example a hydrogen-fluoride based solution to clean the surfaces of the first Ag layer 18 and the metallic layer 26. Or this pre-cleaning process may take a form of a dry-etching process using for example an Ar-based plasma to treat the adhesion layer 14, barrier layer 16, first Ag layer 18, second Ag layer 24 and metallic layer 26. As shown in FIG. 3, a bonding process is performed by following steps: aligning the first Ag layer 18 of the first substrate 10 and the metallic layer 26 of the second substrate 20; bringing them into contact; applying an uniform load to the first substrate 10 and the second substrate 20; heating the first substrate 10 and the second substrate 20 including their first Ag layer 18 and 24 and metallic layer 26 to a predetermined temperature and maintaining the predetermined temperature for a predetermined time span, wherein the predetermined temperature should be higher than the eutectic temperature of Ag—Sn; and cooling down and removing the load to complete the bonding process. According to the present embodiment, the predetermined temperature ranges from 250 to 350° C. and the predetermined time span is about 30 minutes. Please refer to FIGS. 3 and 4 together. FIG. 4 is a schematic enlarged view of the intermixed Ag3Sn intermetallic compounds 32 and the Sn matrix 34. During the bonding process, a part of the first Ag layer 18 and a part of the second Ag layer 24 would react with the first Sn layer 28 to form Ag3Sn intermetallic compounds 32; the rest of the first Sn layer 28 that is not reacted would be dispersed to form Sn matrix 34. The Ag3Sn intermetallic compound 32 and the Sn matrix 34 collectively are referred to as an alloy layer 30. Since the first Ag layer 18 and the second Ag layer 24 would react with the first Sn layer 28 simultaneously, the resulted Ag3Sn intermetallic compound 32 in the eutectic alloy layer 30 is uniformly dispersed within the Sn matrix 34. This result would not only increase bonding strength but also would further reduce gradient stress caused by the bonding because of the symmetric arrangement of the metallic film stacks 50.

Additionally, to increase eutectic reaction and bonding strength, it is possibly to perform an optional annealing process to the bonded first substrate 10 and second substrate 20. For example, the bonded first substrate 10 and second substrate 20 may be put into an oven or furnace to subject to annealing. Such an optional process can ensure plenty of Sn atoms to be turned into Ag3Sn. The annealing temperature is preferably between 350 to 450° C. Since the annealing process may be done to the bonded wafers/substrates by a batch, using it to improve bonding strength is more appropriate for mass production compared to performing a long-heating bonding one by one.

Figure 5:
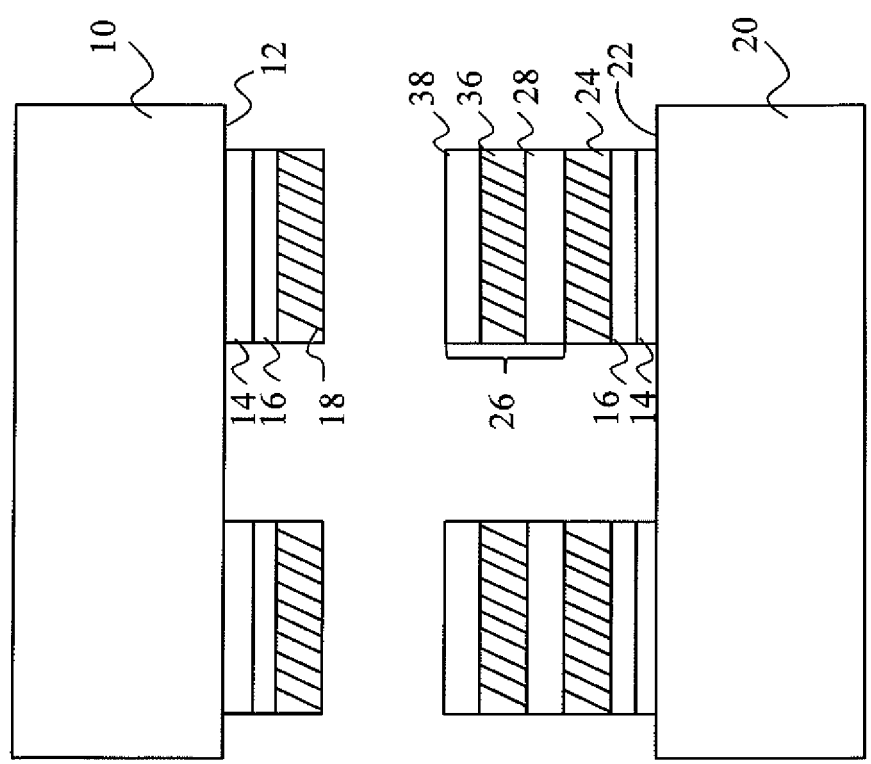
FIGS. 5-6 illustrate a substrate bonding method in accordance with the second preferred embodiment of the present invention.
Figure 6:
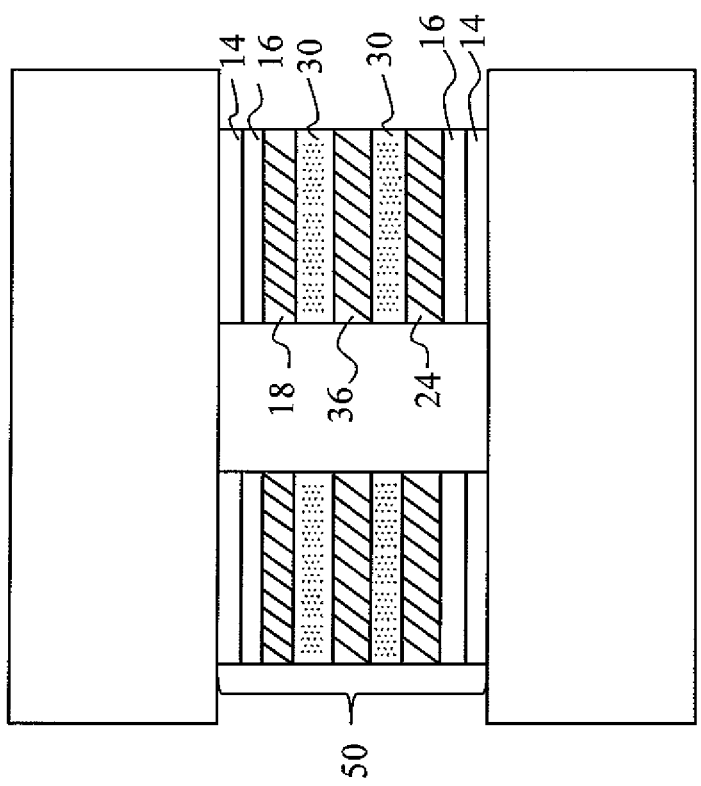

FIGS. 5-6 illustrate a substrate bonding method in accordance with the second preferred embodiment of the present invention. The second preferred embodiment is a variation of the first preferred embodiment and their difference lays on the composition of the metallic layer 26 of the second substrate 20. As shown in FIG. 5, the metallic layer 26 of the second substrate 20 may comprise alternatively stacked Ag layers and Sn layers. For example, in the second preferred embodiment, a third Ag layer 36 and a second Sn layer 38 are sequentially formed after forming the first Sn layer 28. Of course, based on the requirements of different products, the metallic layer 26 of the present invention may be formed by alternatively formed Ag layers and Sn layers, and then a combination of lithography and etching processes or a lift-off process is performed. For the second embodiment, the ensuing bonding and annealing processes are the same as the ones of the first embodiment, so their descriptions are omitted here. Please refer to FIGS. 4 and 6 together. During the bonding process, a part of the first Ag layer 18, a part of the second Ag layer 24 and a part of the third Ag layer 36 would react with the first Sn layer 28 and the second Sn layer 38 respectively to form Ag3Sn intermetallic compounds 32; the rest of the first Sn layer 28 and the second Sn layer 38 that are not reacted would be dispersed to form the Sn matrix 34. The Ag3Sn intermetallic compounds 32 and the Sn matrix 34 collectively are referred to as an alloy layer 30. In the present embodiment, there are two alloy layers 30 and a third Ag layer 36 sandwiched by the two alloy layers 30.

According to the principles of the first preferred embodiment and the second preferred embodiment, the inventors of the present invention planned five process condition sets for the substrate bonding method of the present invention by tuning the composition of the metallic layer 26 and annealing time span, prepared multiple package structures of the same size made by the five process condition sets. Then, inventors performed strength tests including shear test and pressurized water permeability test to the multiple package structures made by the five process condition sets. Each set of the conditions is shown as the following.

First Set of Conditions

Figure 7:
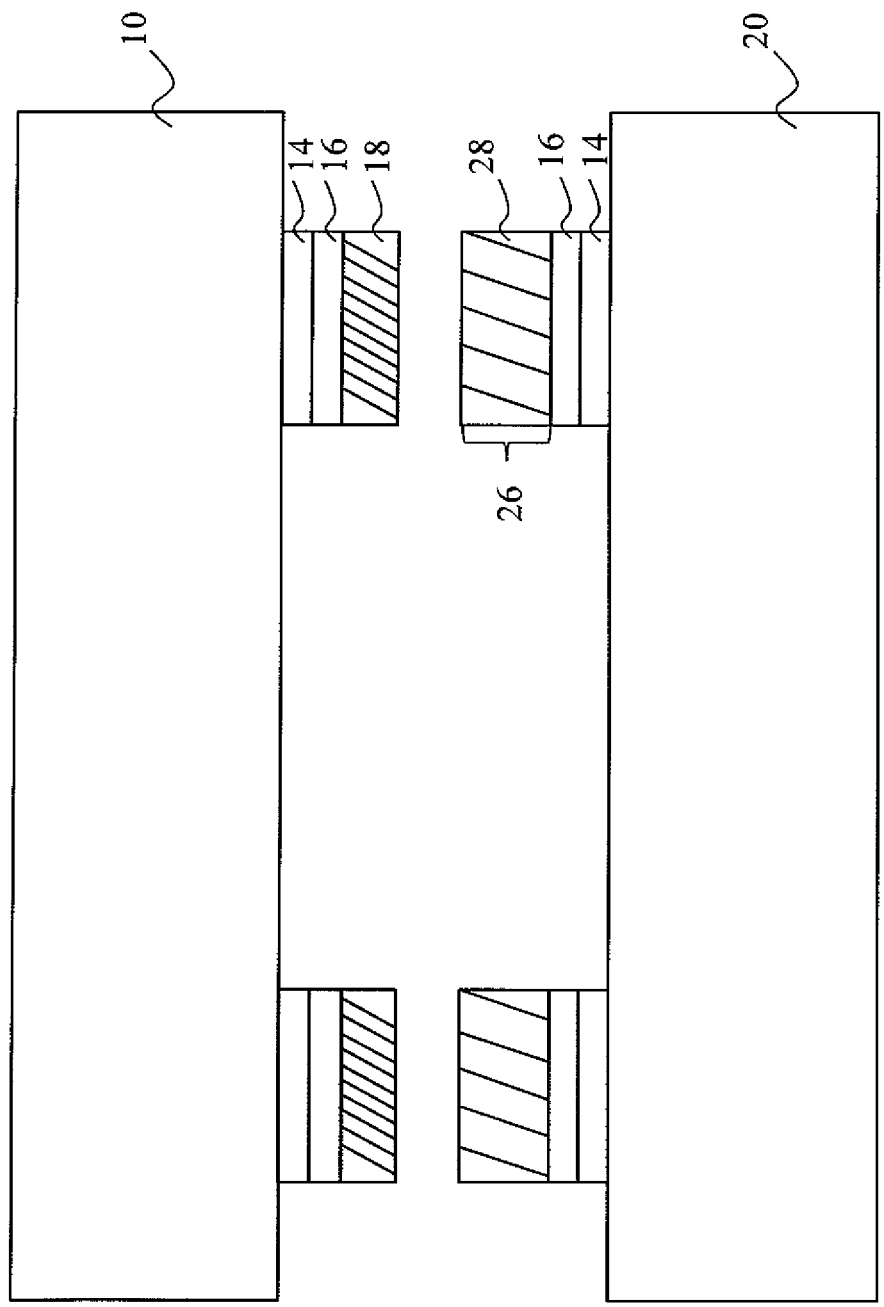
FIG. 7 is a schematic view of the first set of substrate arrangement in accordance with the present invention.

Please refer to FIG. 7. The film arrangement for the first substrate 10 to be tested by the first set of conditions is the same as the one of the first embodiment. The film arrangement for the second substrate 20 to be tested by the first set of conditions has the same metallic layer 26 (comprising only the first Sn layer 28) as the one of the first embodiment, but it does not have the second Ag layer 24. Furthermore, no annealing process is performed after the first substrate 10 and second substrate 20 are bonded together.

Second Set of Conditions

Please refer to FIG. 7 again. The arrangement of the first Ag layer 18 and the metallic layer 26 is the same as the one said in the first set of conditions. The difference is that an annealing process is performed for one hour for the second set of conditions.

Third Set of Conditions

Please refer to FIG. 3. The arrangement of the first Ag layer 18, the second Ag layer 24 and the metallic layer 26 for the first substrate 10 and the second substrate 20 is the same as the one in the first embodiment. The difference is that an annealing process is performed for one hour for the third set of conditions.

Fourth Set of Conditions

Please refer to FIG. 2 again. The arrangement of the first Ag layer 18, the second Ag layer 24 and the metallic layer 26 is the same as the one in the first embodiment. The difference is that an annealing process is performed for one and half hours for the fourth set of conditions.

Fifth Set of Conditions

Please refer to FIG. 5. The arrangement of the first Ag layer 18, the second Ag layer 24 and the metallic layer 26 for the first substrate 10 and the second substrate 20 is the same as the one in the second embodiment. The difference is that an annealing process is performed for one hour for the fifth set of conditions.

Table 1 shows the experimental data for package structures completed by first set to fifth set of conditions under shear test and pressurized water permeability test.

TABLE 1

Shear test and pressurized water permeability test results for five sets of conditions

| Set no. | Shear test (MPa) | Pressurized water permeability test (amount of chips passing the test/amount of total tested chips) |
|---|---|---|
| 1 | 0 | 0/233 |
| 2 | <30 | 10/233 |
| 3 | >70 | 29/233 |
| 4 | >80 | 75/233 |
| 5 | >70 | 212/213 |

As shown in Table 1, by comparing the results for the first set and second set of conditions, it is found that the package structures of the first set have inferior strength due to no annealing process performed after bonding process and two wafers of the same package structure would fall apart right after they have been bonded; the package structures of the second set have better strength due to an annealing process performed after bonding process and it appears post-bonding annealing process can facilitate the forming of Ag3Sn intermetallic compounds, thereby increasing bonding strength. By further comparing the results for the second set, third set and fifth set of conditions, it is found that the package structures of the second set have inferior strength compared to the package structures of the third and fifth sets because the second substrate 20 comprises no second Ag layer 24 and the forming of Ag3Sn intermetallic compounds of the second set is less complete even under the same bonding and annealing conditions. Moreover, for the hermetic sealing property assessed by pressurized water permeability test, only 10 out of 233 package structures of second set passed. It is inferred that for the third and fifth sets since their second substrates 20 have film stacks of the first Ag layer 18, the second Ag layer 24, metallic layer 26 and first Sin layer 28 or second layer 38, the package structures would have higher ratio of Ag3Sn intermetallic compounds and lower ratio of Sn matrix 34 in the metallic layer 30, thereby increasing bonding strength and hermetic sealing property. Therefore, we can evidentially conclude that using one or more film stacks of alternatively disposed Ag layers and Sn layers would lead to better bonding strength and hermetic sealing property. By further comparing the results for the third set and fourth set of conditions, it is found that the package structures of the fourth set have better bonding strength due to longer post-bonding annealing to allow higher ratio of Ag3Sn intermetallic compounds in the metallic layer 30 to be formed.

FIG. 3 is a schematic view of the package structure in accordance with the third preferred embodiment of the present invention. The package structure of the third embodiment is formed by the bonding method of the present invention. As shown in FIG. 3, the package structure of the third embodiment comprises a first substrate 10, a second substrate 20 and a plurality of metallic film stacks disposed between the first substrate 10 and the second substrate 20. Each of the plurality of metallic film stacks at least comprises a first Ag layer 18, a second Ag layer 24 and an alloy layer 30 between the first Ag layer 18 and the second Ag layer 24. Please refer to FIGS. 3 and 4 together now. It is worth noticing that the alloy layer 30 comprises Ag3Sn intermetallic compounds 32 and Sn matrix 34, wherein the Ag3Sn intermetallic compounds 32 are uniformly distributed in the Sn matrix.

Furthermore, the first substrate 10 and second substrate 20 may be any substrates made by any materials suitable for electronic packaging such as silicon, GaAs, Sapphire, metallic materials, ceramic materials, glass or other semiconductor materials. The present invention exemplarily uses a wafer as the substrate in this spec. A wafer usually comprises single crystal silicon, silicon on insulator, silicon-germanium substrate or a combination thereof. Moreover, the first Ag layer 18 is in contact with the first surface 22 of the first substrate 10 and the second Ag layer 24 is in contact with the second surface 22 of the second substrate 20. An adhesion layer 14 such as a Cr or Ti layer may be disposed between each metal film stack 50 and the first substrate 10 and each metal film stack 50 and the second substrate 20. A barrier layer 16 comprising Ni and/or Pt may be disposed between the adhesion layer 14 and each metal film stack 50.

FIG. 6 is a schematic view of the package structure in accordance with the fourth preferred embodiment of the present invention. Please refer to FIG. 6. The fourth embodiment differs from the third embodiment on their structure. The metallic film stack 50 of the fourth embodiment not only comprises the first Ag layer 18 and the second Ag layer 24 but also comprises two alloy layers 30 and a third Ag layer 36 disposed between the two alloy layers 30.

Figure 8:
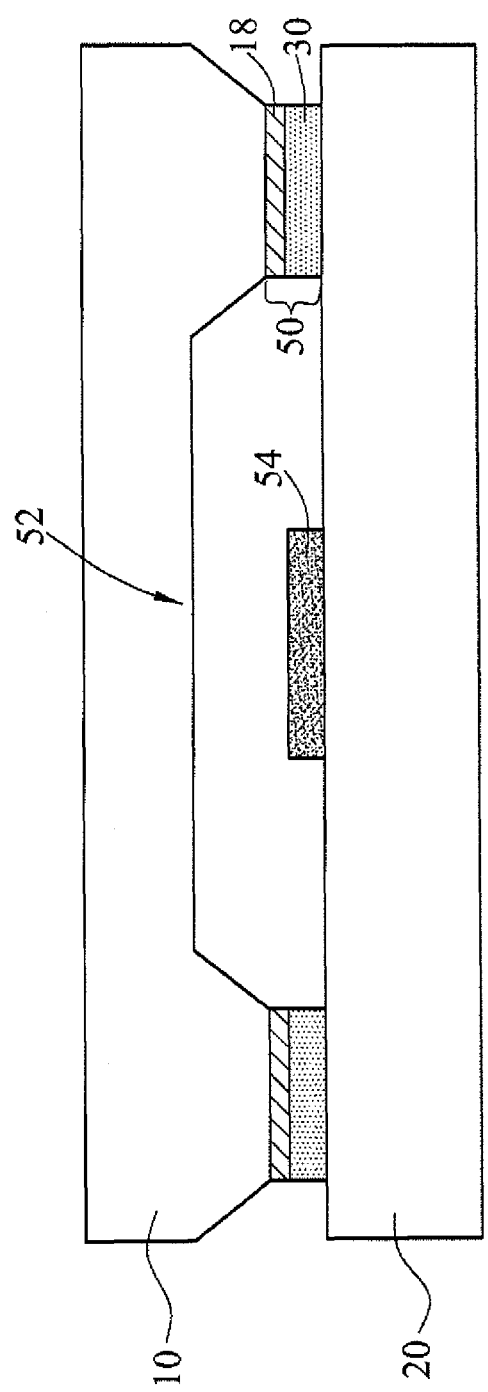
FIG. 8 is a schematic view of the package structure in accordance with the fifth preferred embodiment of the present invention.

FIG. 8 is a schematic view of the package structure in accordance with the fifth preferred embodiment of the present invention. The bonding method of the present invention could be applied to different kinds of wafers. As shown in FIG. 8, the first substrate 10 may be a cap wafer or a MEMS wafer and the second substrate 20 may be a wafer different from the first substrate 10. For example, the first substrate 10 may be a cap wafer with at least a recess 52 disposed therein/thereon and the second substrate 20 may be a MEMS wafer with at least one micro electro mechanical device 54 disposed therein/thereon. The metallic film stack 50 of the third embodiment or the fourth embodiment may be disposed between the first substrate 10 and the second substrate 20. Similarly, the metallic film stack 50 may at least comprise the alloy layer 30, the first Ag layer 18 and the second Ag layer 24. However, the adhesion layer 14 and barrier layer 16 may be disposed optionally.

Figure 9:
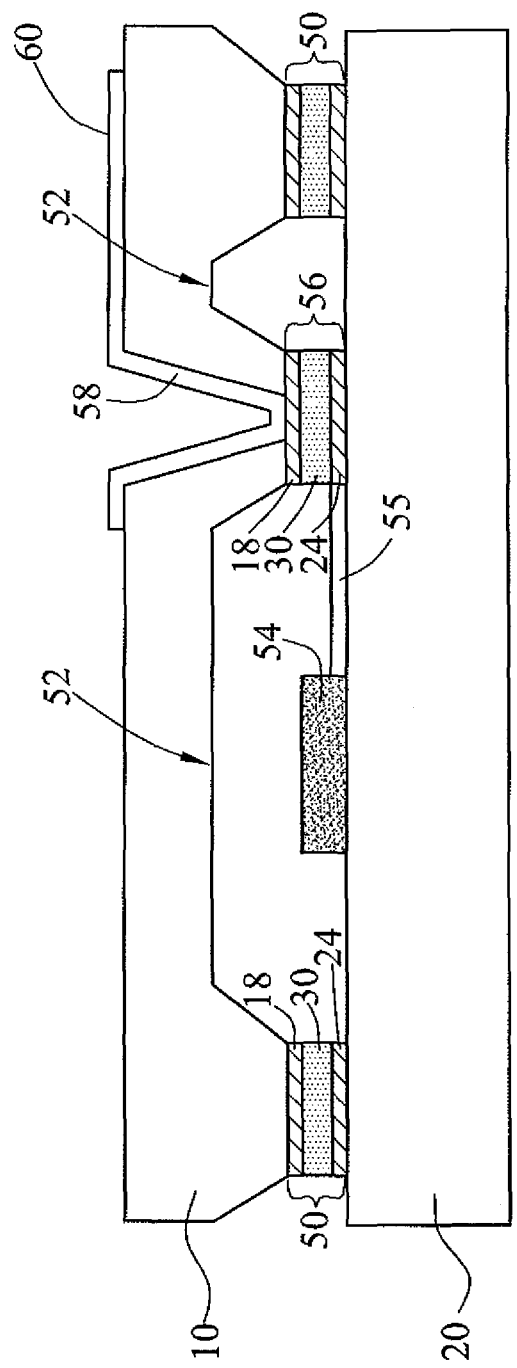
FIG. 9 is a schematic view of the package structure in accordance with the sixth preferred embodiment of the present invention.

FIG. 9 is a schematic view of the package structure in accordance with the sixth preferred embodiment of the present invention. The sixth preferred embodiment is a variation of the fifth embodiment. In the sixth preferred embodiment, the first substrate 10 may be a cap wafer with at least a recess 52 disposed therein/thereon and the second substrate 20 may be a MEMS wafer with at least one micro electro mechanical device 54 disposed therein/thereon. The metallic film stack 50 of the third embodiment or the fourth embodiment may be disposed between the first substrate 10 and the second substrate 20. Similarly, the metallic film stack 50 may at least comprise the alloy layer 30, the first Ag layer 18 and the second Ag layer 24. However, the adhesion layer 14 and barrier layer 16 may be disposed optionally.

Furthermore, at least one conductive pad 56 is disposed between the first substrate 10 and second substrate 20 to be in electrical connection to a micro electro mechanical device 54 via a conductive layer 55 and at least one through hole 58 is disposed within the first substrate 10 to correspond to the conductive pad 56. The conductive pad 56 also comprises Ag3Sn intermetallic compounds. There is a metal layer 60 disposed within the through hole 58 to electrically connect to the conductive pad 56 and configured to output electrical signals of the micro electro mechanical device 54.

Figure 10:
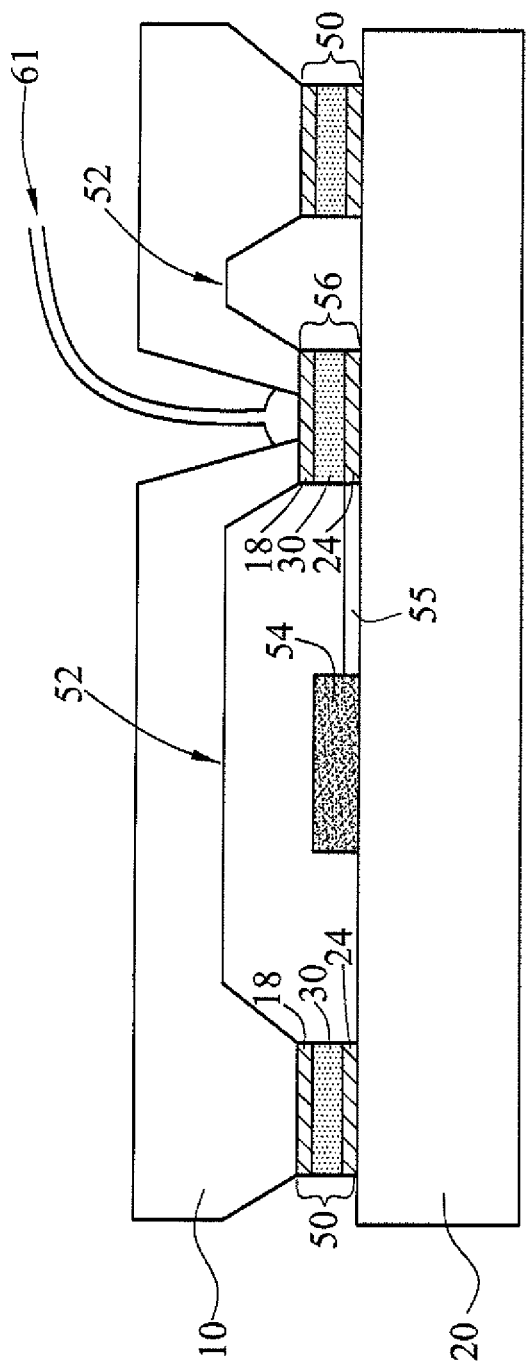
FIG. 10 is a schematic view of the package structure in accordance with the seventh preferred embodiment of the present invention.

FIG. 10 is a schematic view of the package structure in accordance with the seventh preferred embodiment of the present invention. The difference between the seventh embodiment and the sixth embodiment lays is that in the seventh embodiment electrical signals of the micro electro mechanical device 54 are output via a bonding wire 61 to another electronic device (not shown) instead of using the metal layer 60 disposed within the through hole 58.

Figure 11:
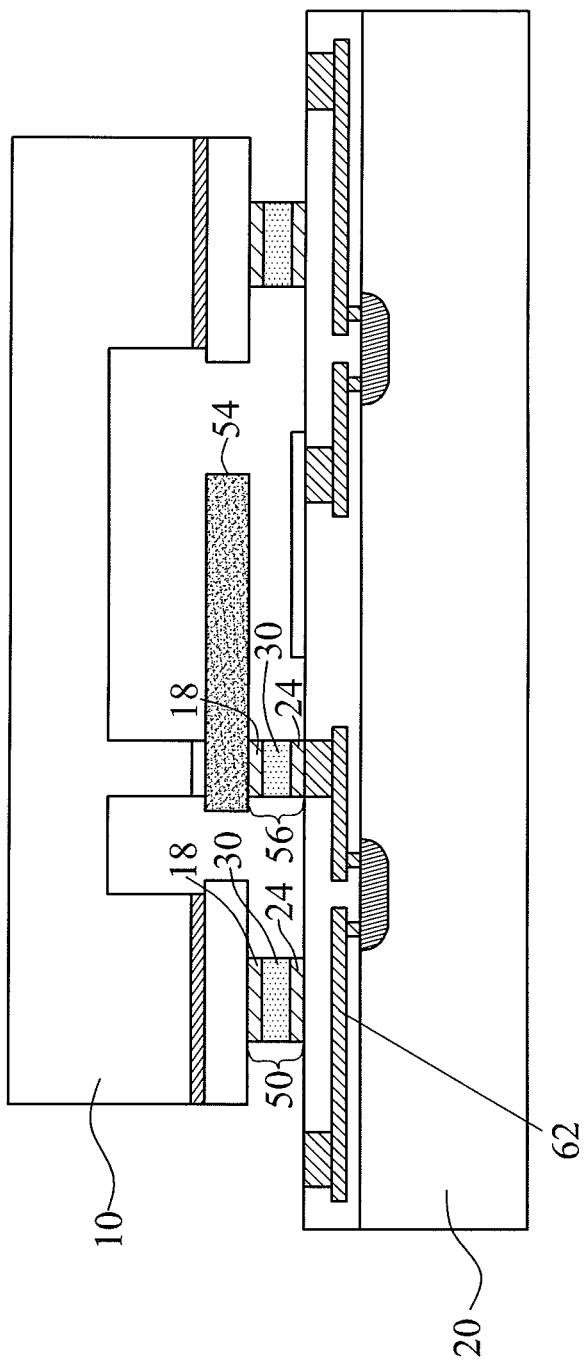
FIG. 11 is a schematic view of the package structure in accordance with the eighth preferred embodiment of the present invention.

FIG. 11 is a schematic view of the package structure in accordance with the eighth preferred embodiment of the present invention. As shown in FIG. 11, the first substrate 10 may be a MEMS wafer with at least one micro electro mechanical device 54 disposed therein/thereon and the second substrate 20 may be a CMOS wafer with at least one circuitry device 62. The metallic film stacks 50 of the third embodiment or fourth embodiment may be disposed between the first substrate 10 and second substrate 20 to hermetic seal the micro electro mechanical device 54. Similarly, the metallic film stacks 50 comprises an alloy layer 30, a first Ag layer 1, a second Ag layer, an optional adhesion layer 14 and an optional barrier layer 16.

Furthermore, at least one conductive pad 56 is disposed between the first substrate 10 and second substrate 20 to provide a robust mechanical support to the micro electro mechanical device 54 and also electrical contact to an circuitry device 62, so electrical signals of the micro electro mechanical device 54 are output via the conductive pad 56 to the circuitry device 62 of the CMOS wafer and then are output via interconnects of the CMOS wafer. The conductive pad 56 also comprises Ag3Sn intermetallic compounds.

The present invention disclosed a package structure and a substrate bonding method, wherein a Ag layer is formed on one wafer and a film stack of alternatively disposed Ag and Sn layers is formed on another wafer. During the wafer bonding process, since Ag3Sn intermetallic compounds can be formed from the boundaries of the Sn layer and its adjacent layers, time required for inter-diffusion is shorten and Ag3Sn intermetallic compounds can be formed by Ag and Sn atoms in a shorter period of time. Furthermore, a post-bonding annealing process is added to transform massive amount of pure Sn atoms into Ag3Sn intermetallic compounds, thereby further improving bonding strength and hermetic sealing property.

What is claimed is:

1. A substrate bonding method comprising:
providing a first substrate and a second substrate with the first substrate covered by a first Ag layer and the second substrate covered by a second Ag layer and a metallic layer from bottom to top, wherein the metallic layer comprises a first Sn layer; and
performing a bonding process including:
aligning the first substrate and the second substrate to bring the metallic layer into contact with the first Ag layer;
applying a load to the first substrate and the second substrate while heating to a predetermined temperature in order to form Ag3Sn intermetallic compounds; and
cooling and removing the load to complete the bonding process.

2. The substrate bonding method of claim 1, further comprising performing an annealing process after the bonding process.

3. The substrate bonding method of claim 2, wherein the temperature of the annealing process ranges from 350 to 450° C.

4. The substrate bonding method of claim 1, wherein the predetermined temperature ranges from 250 to 350° C.

5. The substrate bonding method of claim 1, further comprising forming a adhesion layer between the first Ag layer and the first substrate and between the second Ag layer and the second substrate.

6. The substrate bonding method of claim 5, wherein the adhesion layer comprises Cr or Ti.

7. The substrate bonding method of claim 5, further comprising forming a barrier layer between the adhesion layer and the first Ag layer and between the adhesion layer and the second Ag layer, wherein the barrier layer comprises Ni or Pt.

8. The substrate bonding method of claim 1, further comprising forming a third Ag layer on the first Sn layer and forming a second Sn layer on the third Ag layer before the bonding process.

* * * * *